US006031917A

United States Patent [19]

Mathur

[11] Patent Number: 6,031,917

[45] Date of Patent: Feb. 29, 2000

[54] ACTIVE NOISE CONTROL USING BLOCKED MODE APPROACH

[75] Inventor: Gopal P. Mathur, Mission Viejo, Calif.

[73] Assignee: McDonnell Douglas Corporation, Long Beach, Calif.

[21] Appl. No.: 08/870,552

[22] Filed: Jun. 6, 1997

[51] Int. Cl.[7] .................................................... H03B 29/00

[52] U.S. Cl. ....................................... 381/71.11; 381/71.7

[58] Field of Search ................................. 381/71.2, 71.7, 381/71.1, 71.11, 71.12, 94.1

[56] References Cited

U.S. PATENT DOCUMENTS

| | | |
|---|---|---|
| 4,449,235 | 5/1984 | Swigert . |
| 5,091,953 | 2/1992 | Tretter . |
| 5,233,540 | 8/1993 | Andersson et al. . |
| 5,245,552 | 9/1993 | Andersson et al. . |
| 5,283,834 | 2/1994 | Goodman et al. . |
| 5,355,417 | 10/1994 | Burdisso et al. . |
| 5,363,451 | 11/1994 | Martinez et al. . |
| 5,396,414 | 3/1995 | Alcone . |
| 5,410,607 | 4/1995 | Mason et al. . |
| 5,415,522 | 5/1995 | Pza et al. . |
| 5,420,932 | 5/1995 | Goodman . |
| 5,473,698 | 12/1995 | Garnjost et al. . |
| 5,498,127 | 3/1996 | Kraft et al. . |
| 5,515,444 | 5/1996 | Burdisso et al. . |
| 5,519,637 | 5/1996 | Mathur . |
| 5,748,750 | 5/1998 | L'Esperance et al. . |

OTHER PUBLICATIONS

Heard: Headphones Do Away With Aircraft Noise, by Greg Miller, Times Staff Writer, Los Angeles Times, Jun. 17, 1996.

Broadband Active Structural Acoustic Control of Panel Sound Transmission, by G.P. Mathur, B.N. Tran, M.A. Simpson, D.K. Peterson, G.K. Toth & W.A. Weeks, ACTIVE 95, Newport Beach, CA, Jul. 6–8, 1995, pp. 275–282.

*Primary Examiner*—Vivian Chang
*Attorney, Agent, or Firm*—Stout, Uxa, Buyan & Mullins, LLP; Donald E. Stout

[57] ABSTRACT

A method and apparatus for reducing noise across a broadband frequency range transmitted by a vibrating panel by blocking or otherwise opposing increasing non-resonant modes of vibration in the panel. The method and apparatus includes mounting an array of sensors on a surface of the vibrating panel. The sensors generate an input signal representing the incident vibration in the panel. The input signal is sent to an adaptive controller which generates an output signal. The output signal is essentially equivalent to the input signal but opposing in phase. The output signal is then sent and distributed to an array of actuators which are also mounted to a surface of the vibrating panel. The output signal forces each of the vibrating actuators to vibrate the panel in opposition to the incident vibration in the panel and thus reduce the transmitted noise. Continual readings of the vibration in the panel allows the sensors to update the input signal and thus adjust the vibration of the actuators. This approach requires only a simple adaptive controller to actively control broadband noise transmitted through the panel.

25 Claims, 7 Drawing Sheets

ACTIVE NOISE CONTROL USING BLOCKED MODE APPROACH

FIELD OF THE INVENTION

The present invention relates generally to noise control and more particularly, to the active control of noise transmitted through structures.

BACKGROUND OF THE INVENTION

Various methods and apparatus have been proposed for actively reducing airborne noise transmitted through a structure. The general concept consists of introducing control vibrations into the vibrating structure to combine with the incident, noise transmitting vibration field existing in the structure such that they result in lower vibrations and significantly lower transmitted noise.

Sound transmission through a structure and particularly, sound transmitted through a panel subject to airborne noise is, generally, dominated by the mass-controlled, acoustically-fast, non-resonant modes of vibration of the structure. This is due to the spatial coupling of the lower-order structural modes of vibration with the excitation field (airborne noise) affecting the structure. The lower frequency, longer wavelength modes of vibration in the structure, when excited at frequencies much higher than the lower order resonant frequencies of the structure, become acoustically fast and radiate sound much better than the resonantly excited modes of vibration. As a result, the lower-order, non-resonant modes of vibration carry the majority of incident energy and noise through the structure and the resonant modes carry a lesser amount of the acoustic energy being transmitted.

The most important non-resonant mode for a planar structure or panel is the first non-resonant mode (1, 1). In general, a panel will vibrate at its first non-resonant mode when it is excited at a frequency higher than its own resonant frequency and when its modal wave number equals the acoustic wave number at the frequency of the excitation field. This first mode is always the first to become acoustically fast. If the frequency of the excitation field acting on the panel increases, higher order non-resonant vibration modes will also become acoustically fast as their modal wave numbers equal or exceed the acoustic wave number at the excitation frequency.

The prior art has pursued the active control of airborne noise transmitted by a vibrating panel. For example, the reduction of noise transmitted into an aircraft cabin by a vibrating interior panel. In this application, active noise control techniques have been developed for reducing the aircraft cabin noise levels at a particular tone. Most of these techniques function by determining the excitation frequency of the particular tone and then attempting to cancel that tone. Vibrations are then induced into the panel to generally oppose the particular excitation frequency. However, these techniques are only effective at reducing repetitive or periodic noise at a particular frequency or tone and do not address the cancellation or reduction of broadband noise transmitted through the panel.

More recently, prior art techniques have utilized piezoelectric materials to actively sense the incident vibration in a structure or panel as well as to counter those vibrations. However, these approaches have only been attempted for controlling tonal or periodic noise within a narrow frequency range and not for reducing noise having a broadband frequency range. Additionally, these approaches use a complex adaptive controller as the centerpiece of the global noise control strategy. These complex adapters are bulky, expensive, and inefficient.

Thus, there is a need for an apparatus and method for reducing airborne noise having a broadband frequency range transmitted by a vibrating structure. There is also a need for an apparatus and method for reducing noise transmitted through a vibrating structure where the frequency of the vibrations are broad and are rapidly changing. In addition, there is also a need for such an apparatus and method that is inexpensive, easy to incorporate and simple in operation.

SUMMARY

In accordance with this invention, an apparatus and method for reducing airborne noise having a broadband frequency range and transmitted by a vibrating structure is provided. Further, the present invention provides an apparatus and method for such broadband noise reduction utilizing a simplified adaptive controller without the need for complex and bulky electronics. The apparatus utilizes a plurality of sensors which are mounted on the vibrating structure transmitting the noise. Each of the sensors is shaped to sense vibration across a particular non-resonant frequency mode which is then converted into an electronic input signal. The input signal is sent to an adaptive controller which interprets the input signal and generates an electronic output signal. This output signal is sent to a plurality of actuators. Each of the actuators is also attached to the structure and is forced to vibrate in response to the output signal across the same non-resonant mode sensed by the sensors. The actuators are configured generally equivalent to the sensors such that the forced actuator vibration is generally equivalent and opposing to the sensed vibration in the structure.

The noise reducing apparatus of the present invention generally includes a plurality of sensors, an adaptive controller and a plurality of actuators. The plurality of sensors are generally spaced apart and are attached to the vibrating structure or panel transmitting the noise. Each of the sensors generates an input signal in response to incident vibrations in the vibrating structure. The input signal has an amplitude and accompanying phase. Each of the sensors is electrically connected to the adaptive controller. The adaptive controller receives each of the input signals and generates an output signal. The output signal generally has a second amplitude and a second phase. The plurality of actuators are also generally spaced apart and attached to the vibrating structure or panel. Each of the actuators receives at least a portion of the output signal from the adaptive controller and moves in response to the output signal. The movement of each of the actuators generally acts to oppose the incident vibration in the structure as well as the noise transmitted.

When the structure transmitting the noise is a vibrating panel, the plurality of sensors are generally distributed in a spaced apart fashion on a first side of the panel. The plurality of actuators are also distributed in a spaced apart fashion, but on the second side of the panel. The first side of the panel preferably faces a source of the airborne noise or vibration in the vibrating panel.

Each of the plurality of sensors is made from a piezoelectric material which has the ability to convert mechanical energy into electrical energy. Each piezoelectric material sensor is specifically shaped to sense across a first non-resonant mode of vibration in the panel and also across a third non-resonant mode of vibration in the panel. Each sensor is composed of three individual sensing elements attached along an axis of the panel and three additional individual sensing elements are attached along a perpendicular axis. Along each of the axes, each of the three sensing elements generates an individual input signal having a phase and amplitude. These input signals are combined using a voltage adder or summing device to produce a pair of input signals. A phase reverser is used for the middle sensing elements along each axis to produce an input signal having an appropriate phase for the incident vibration in the panel.

Each of the actuator assemblies of the present invention is made from a piezoelectric material which is shaped to specifically vibrate across the first and third non-resonant modes of the vibration of the panel when subject to the output signal generated by the adaptive controller. Each actuator comprises three actuating elements attached along one axis of the panel and three actuating elements are also attached perpendicular to the first axis on the panel. The output signal from the adaptive controller is distributed to each of the plurality of actuators and actuator elements through a plurality of voltage splitters and phase reversers incorporated into each actuator.

The method of the present invention for reducing airborne noise transmitted by a vibrating panel includes measuring the first non-resonant mode of vibration in the vibrating panel and generating an input signal representing that vibration. The input signal is then sent to a controller. The controller generates an output signal and sends the output signal to the plurality of actuators mounted on the vibrating panel. Each of the plurality of actuators is forced to vibrate according to the input signals and to oppose the first non-resonant mode of vibration in the panel. The first non-resonant mode of vibration in the vibrating panel is measured using a plurality of sensors which are made from a piezoelectric material and attached to a side of the vibrating panel. Each of the piezoelectric sensors generates an input signal which has an amplitude and a phase representing the incident vibration in the vibrating panel. The controller generates an output signal which is essentially equivalent to the input signal but opposing in phase. The output signal acts to energize each of the actuators and force the necessary vibration to reduce the noise.

According to another broad aspect of the method of the present invention, each of the plurality of sensors is used to measure both the first non-resonant mode of vibration and the third non-resonant mode of vibration. Each of the actuators is shaped to actuate at both the first and third non-resonant mode of vibrating in the vibrating panel. In this way each of the sensors senses the first and third non-resonant modes of vibration in the panel and each of the actuators acts to oppose this vibration and reduce the noise transmitted.

BRIEF DESCRIPTION OF THE DRAWINGS

The invention taken together with the additional features and advantages thereof, which was only summarized in the forgoing passages, will become more apparent to those of skill in the art upon reading the description of the preferred embodiments, which follows in this specification taken together with the following drawings where like numbers are used to designate like parts.

DESCRIPTION OF THE PREFERRED EMBODIMENTS

Figure 1:
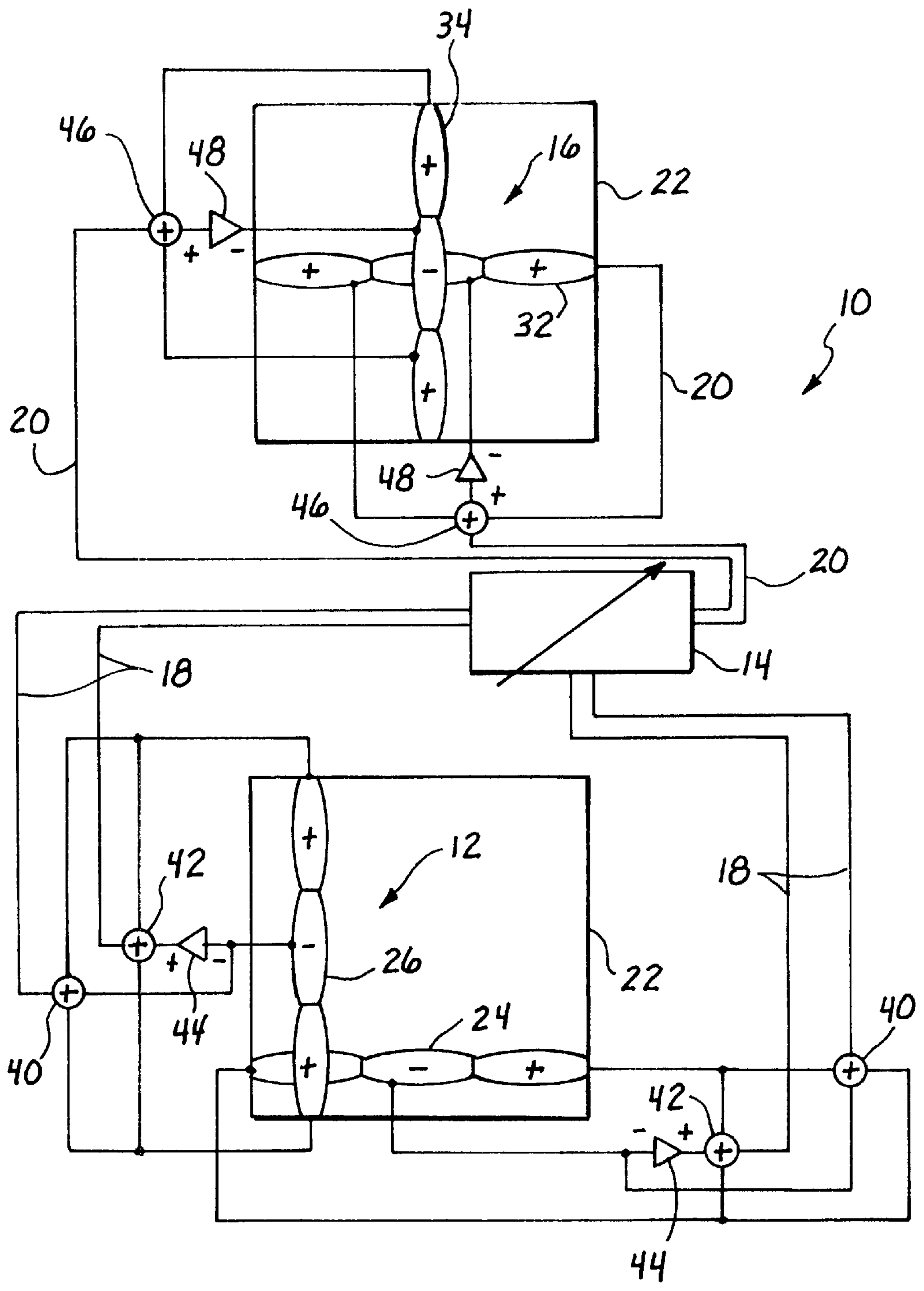
FIG. 1 is a simplified diagram of an apparatus for actively sensing and reducing noise transmitted through a panel according to the principles of the present invention.

Referring to FIG. 1 an apparatus 10 for reducing noise transmitted by or through a vibrating structure and having the features of the present invention is shown in a simplified diagrammatic form. The noise reducing apparatus 10 generally includes a sensor assembly 12, an adaptive controller 14 and an actuator assembly 16. Input signal wires 18 electronically interconnect the sensor assembly 12 and the adaptive controller 14. In a likewise fashion, output signal wires 20 electronically interconnect the adaptive controller 14 with the actuator assembly 16.

The sensor assembly 12 is shown mounted on a panel 22. A panel is illustrated since it generally represents a two dimensional structure through which noise may typically and efficiently be transmitted. For example, the panel 22 may be a trim panel enclosing the passenger cabin of an aircraft (not shown). As a second example, the panel 22 may be an interior wall enclosing or adjacent to a room where noise levels are desired to be reduced. However, the panel 22 may be any structure or structural member experiencing vibration in association with the generation or transmission of noise. The panel 22 may have incident vibration which forces the panel to act as a source of the noise or merely as a panel through which airborne noise is transmitted.

Figure 2A:
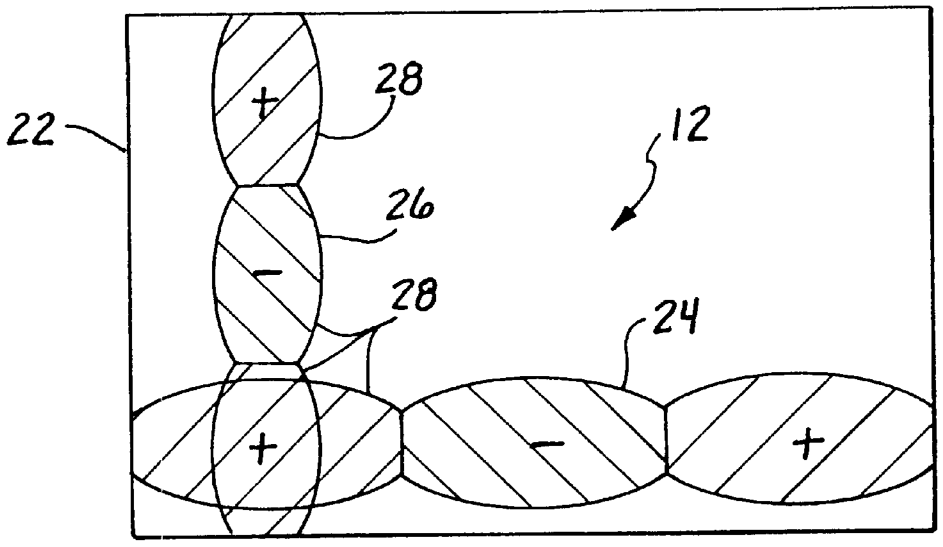
FIG. 2*a* is a simplified diagram of a portion of the apparatus of FIG. 1 showing the sensors mounted on the panel.

Referring now to FIG. 2*a*, a portion of the sensor assembly 12 is shown in greater detail. The sensor assembly 12 comprises a first sensing member 24 and a second sensing member 26. The first sensing member 24 may be aligned along one axis or plane of the panel 22, such as the X axis and the second sensing member 26 may be aligned along the opposing, or Y axis. This allows the two-dimensional planar vibrations of the panel to be fully sensed. In this configuration, each of the first sensing member 24 and the second sensing member 26 comprises three sensing elements 28. Each of the sensing elements 28 is specifically shaped to sense vibrational waves in the panel 22. Thus, in this configuration, each of the first sensing member 24 and second sensing member 26 may sense the third non-resonant mode (3,3) of vibration of the panel 22. However, this configuration may also be used to sense at the first non-resonant mode of vibration (1,1) as will be discussed.

Figure 2B:
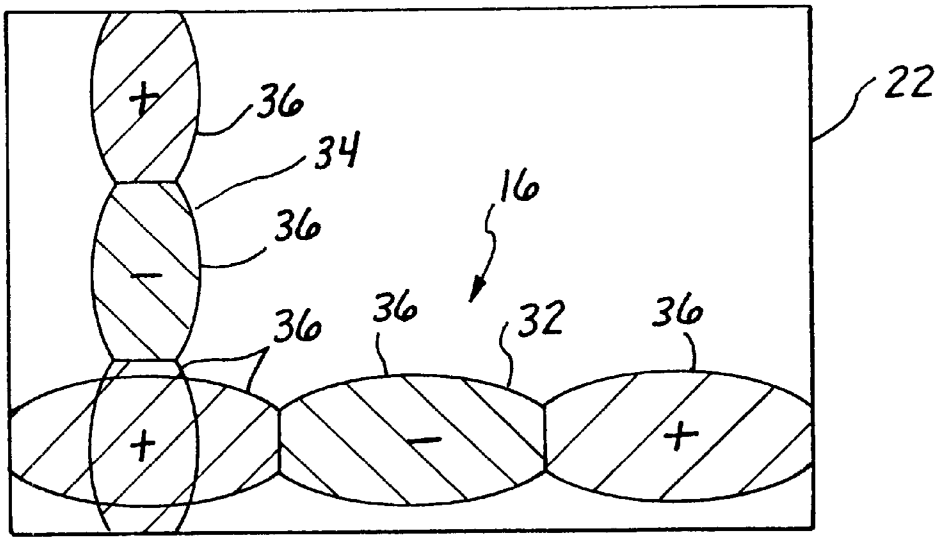
FIG. 2*b* is a simplified diagram of a portion of the apparatus of FIG. 1 showing the actuators of the present invention mounted on the panel.
Figure 5B:
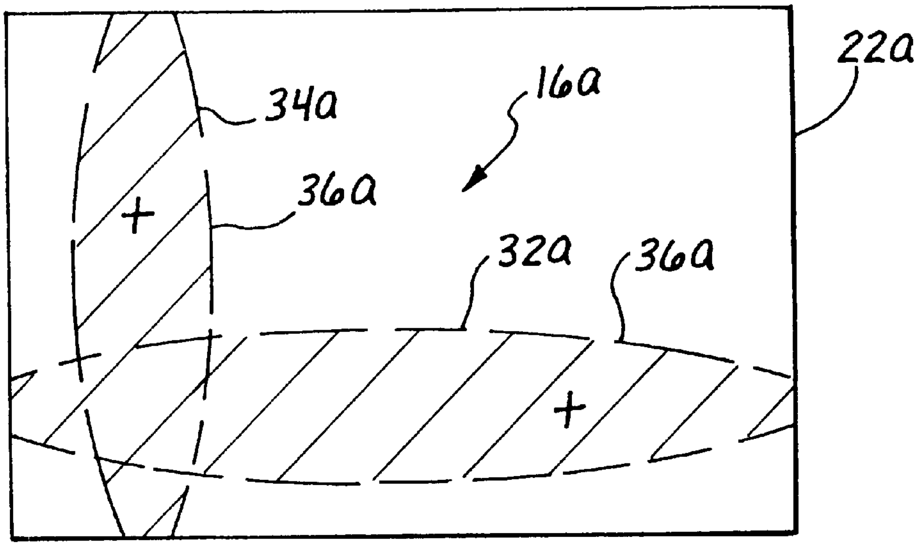
FIG. 5*b* is a simplified diagram showing an alternative embodiment of a pair of actuators of the present invention mounted on a panel.

Referring now to FIG. 2*b*, the actuator assembly 16 is shown in greater detail and includes a first actuating member 32 and a second actuating member 34. The first actuating member 32 may be aligned along one axis or plane of the panel 22, such as the X axis and the second actuating member 34 may be aligned along the opposing, or Y axis, such that two-dimensional planar vibrations may be induced into the panel 22. In this embodiment, each of the first actuating member 32 and the second actuating member 34 comprises three actuating elements 36. By using actuating members 32 and 34, each having three actuating elements 36, the panel 22 may be forced into vibration at both the first and third non-resonant modes.

Each of the first sensing member 24 and the second sensing member 26 is preferably made from a material which generates an electrical signal when flexed. Thus, each of the sensors 24 and 26 generates an input signal representing a mode of vibration of the panel 22 when subject to the vibrations in the panel 22. In a similar fashion each of the first and second actuating members 32 and 34 are preferably made from a material which flexes when subject to an electrical charge such as an output signal. Thus, each actuating member 32 and 34 may be made to vibrate when subject to a continuous controller output signal. The preferred sensor and actuator material may be a piezoelectric material such as a natural piezoelectric crystal or more preferably, a polycrystalline ceramic such as the piezoelectric ceramic materials manufactured by Morgan Matrok, Inc. These piezoelectric ceramics have physical, chemical and piezoelectric characteristics which may be tailored to specific applications and shaped in specific configurations.

When a mechanical force such as a vibration field in the panel 22 is applied to the piezoelectric material of each of the sensing elements 28, the crystalline structure produces a voltage proportional to the pressure or vibration amplitude. In addition, this voltage has a phase which represents the direction of the amplitude of vibration in the panel 22. Conversely, when an electric charge such as the output signal is applied to each of the actuator elements 36, the piezoelectric material changes shape. Thus, each of the actuating members 32 and 34 may be forced to vibrate at a specified frequency based on a continuous output signal having an amplitude and a phase representing that modal frequency.

Figure 3A:
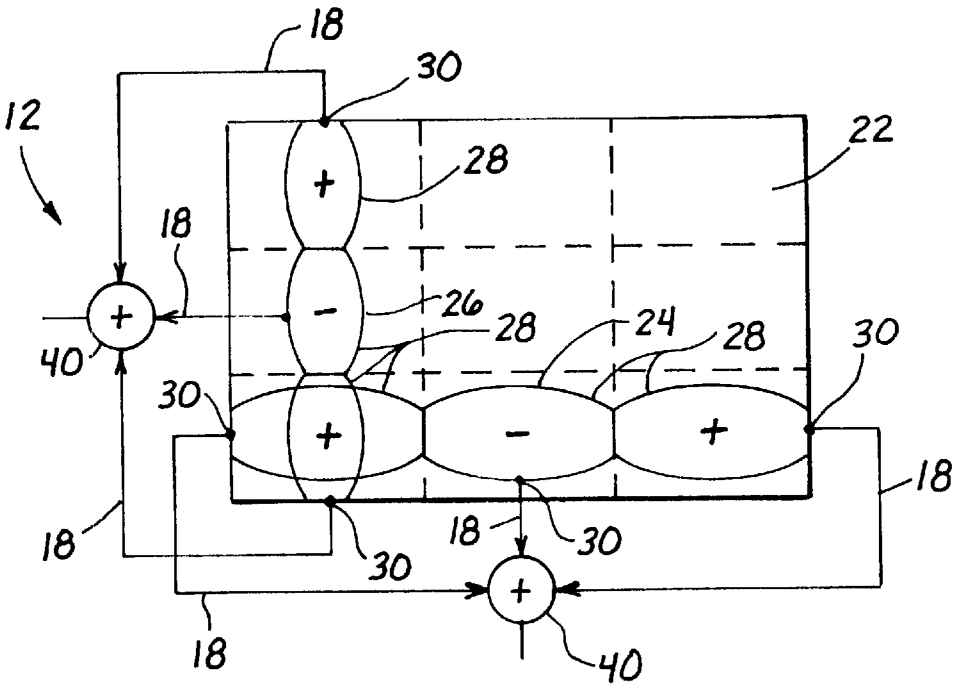
FIG. 3*a* is a simplified diagram of the sensor assembly of FIG. 1 configured for generating an input signal representing the first non-resonant mode of vibration of the panel.

Referring now to FIG. 3*a*, a portion of the sensor assembly 12 which generates an input signal representing the third order non-resonant mode of vibration of the panel 22 is shown attached to the panel 22. In this configuration, each of the first and second sensing members 24 and 26 comprise three sensing elements 28. Additionally, each of the sensing elements 28 is in electrical connection with a first sensing adder 40 through input signal wires 18. Thus, the first sensing member 24 and the second sensing member 26 may each generate a single independent input signal. Input signal wires 18 may be connected to the sensing elements through electrical junctions 30. These electrical junctions may be any conventional junction used to connect an electronic wire to a piezoelectric material.

Figure 3B:
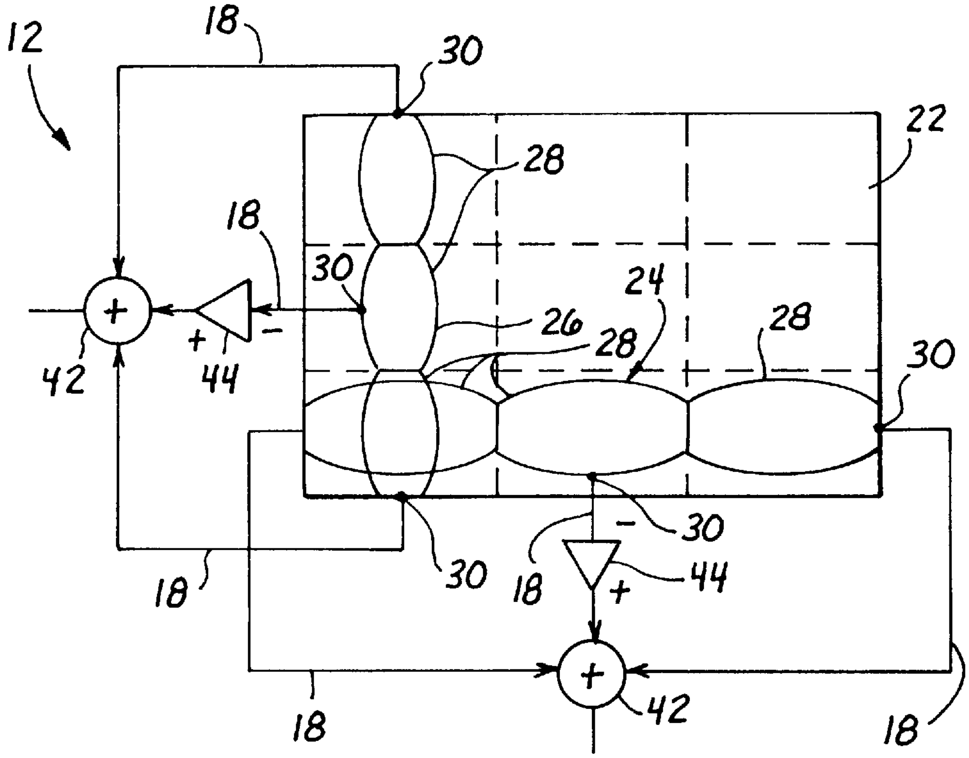
FIG. 3*b* is a simplified diagram of the sensor assembly of FIG. 1 configured for generating an input signal representing the third non-resonant mode of vibration of the panel.

Referring now to FIG. 3*b*, a portion of the sensor assembly 12 which generates an input signal representing the third non-resonant mode of vibration of the panel 22 is shown. In this configuration, each of the first and second sensing members 24 and 26 also comprises three sensing elements 28. In a similar fashion to the portion of the sensor assembly 12, depicted on FIG. 3*a*, each of the sensing elements 28 is in electrical connection with a separate second sensing adder 42. The second sensing adder 42, like the first sensing adder 40 is used to sum the output signals generated by each of the sensing elements 28. However, for sensing the first non-resonant mode of vibration in the panel 22, a first phase reverser 44 is disposed between the central sensing element 28 of both the first sensing member 24 and the second sensing member 26 prior to each of the second sensing adders 42. Thus, each input signal representing the first non-resonant mode of vibration represents an axis of vibration in the panel of the vibration.

Figure 3C:
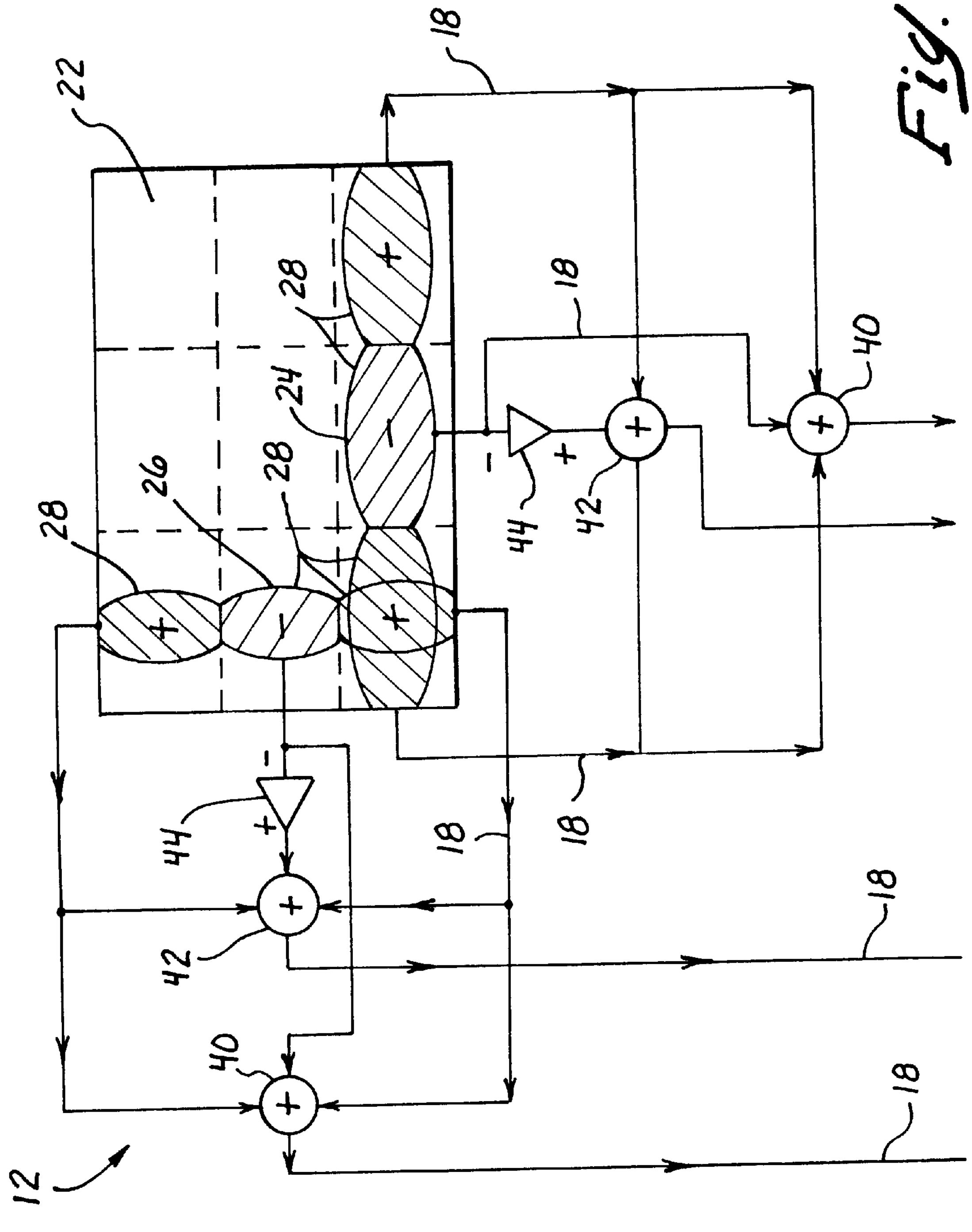
FIG. 3*c* is a simplified diagram of the sensor assembly as shown in FIG. 1 configured for generating an input signal representing both the first and third non-resonant modes of vibration of the panel.

Referring now to FIG. 3*c*, the sensor assembly 12 of the present invention is again shown mounted on panel 22. In this figure, the previously described portion of the sensor assembly is for sensing the first and third non-resonant modes of the panel are merely superimposed. Thus, the first sensing member 24 comprises three sensing elements 28, each in electrical connection with the first sensing adder 40 and a second sensing adder 42 and also include a phase reverser 44 that is electrically interdisposed between the central sensing element 28 and the second sensing adder 42. Similarly the second sensing member 26 comprises three sensing elements 28 each in electrical connection with a first sensing adder 40 and a second sensing adder 42 and including a first phase reverser 44 electrically interdisposed between the central sensing element 28 and the second sensing adder 42.

Input signal wires 18 may generally be used to interconnect each sensing elements 28 with the sensing adders 40 and 42 along with the phase reverser 44. Thus, from each of the first and second sensing adders 40 and 42, a single input signal which is a summation of the amplitude of each of the sensing elements 28 and which has a common amplitude and a common phase is sent to the controller 14.

Figure 3D:
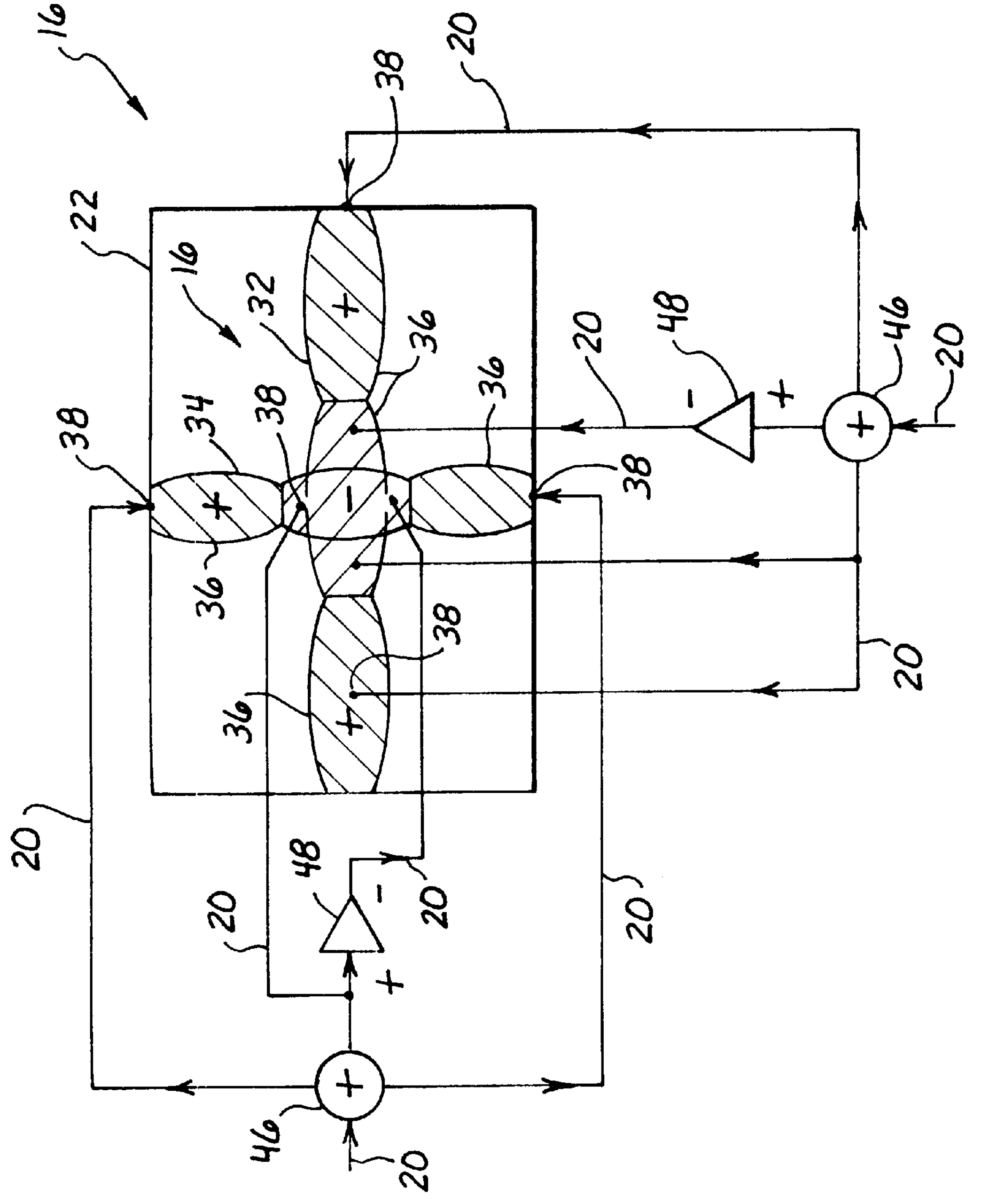
FIG. 3*d* is a simplified diagram of the actuator assembly as shown in FIG. 1 configuration for vibrating in opposition to the first and third non-resonant modes of vibration of the panel.

Referring now to FIG. 3*d*, actuator assembly 16 for actuating or vibrating the panel 22 at its first and third non-resonant modes of vibration is shown. In this configuration, each of the first and second actuating members 32 and 34 comprises three actuating elements 36. These actuating elements 36 may force the panel 22 to vibrate at its first and third non-resonant mode of vibration. Similar to the sensor assembly 12, each of the actuating elements 36 is fitted with an electrical junction 38 in connection with an output signal wire 20. Also, in a similar fashion, each of the actuating elements 36 is in connection with an output signal divider 46. The output signal divider 46 is also in electrical connection with the controller 14 through output signal wires 20. In this fashion, the output signals generated by the controller 14 may be sent to the output signal divider 46 where it is distributed to each of the actuating elements 36. An output phase reverser 48 is disposed between each of the central actuating elements 36 and the output signal divider 46. In this fashion each of the central actuating elements 36 can force the panel in the opposing direction as the outer or outside elements 36 and thus force vibrations at the third non-resonant mode.

Figure 4:
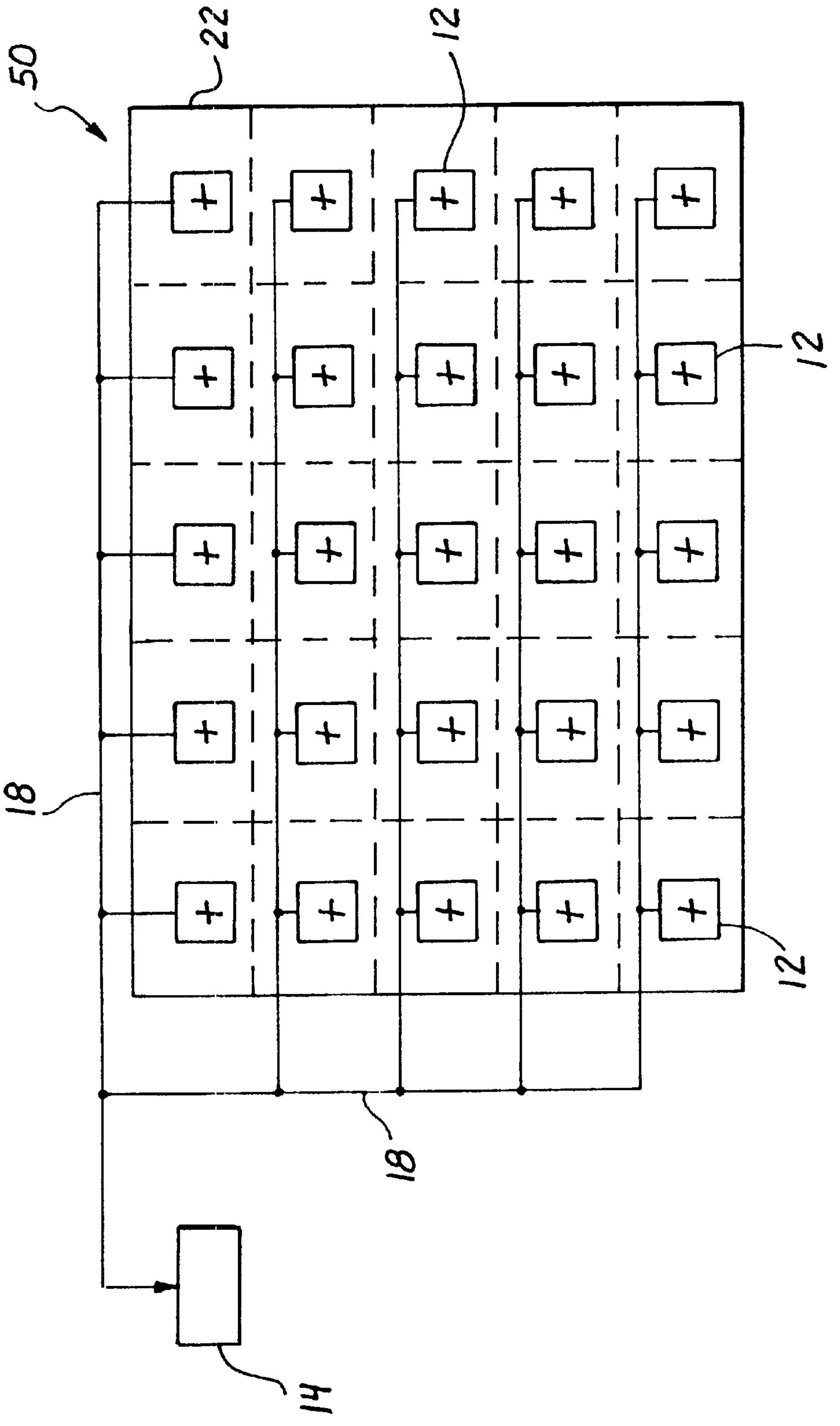
FIG. 4 is a simplified diagram of an array of sensors as depicted in FIG. 1.

Referring now to FIG. 4 in conjunction with FIG. 1, the noise reducing apparatus 10 will be described in greater detail. The noise reducing apparatus 10 generally comprises a plurality of sensor assemblies 12, an adaptive controller 14 and a plurality of actuator assemblies 16. Input signal wires 18 generally interconnect each of the sensor assemblies 12 together and to the adaptive controller 14. Output signal wires 20 generally interconnect the adaptive controller 14 to the plurality of actuator assemblies 16.

The noise reducing apparatus 10 preferably comprises an array 50 of sensor assemblies 12 distributed across the panel 22. Each of the sensor assemblies 12 generally comprises a first sensing member 24 and a second sensing member 26 as previously described. The sensor assemblies 12 are generally distributed as an array 50 across the panel 22 to optimize the sensing of the incident non-resonant mode of vibration in the panel 22. Each sensor assembly 12 generally determines a two-dimensional vibration in the panel 22 and yields an input signal having an amplitude, a phase and a frequency. This input signal generally has a voltage and current along with a phase which is representative of the sensed vibration.

In a similar fashion, the plurality of actuator assemblies 16 are preferably mounted in an array on the panel 22. Each actuator assembly 16 may preferably be mounted on a side of the panel 22 which is not occupied by a sensor assembly 12. Preferably, all of the sensor assemblies 12 may be mounted on one side of the panel 22 and all of the actuator assemblies 16 mounted on the opposite side. Co-located sensors and actuators, both on one side of the panel 22, can also be used.

The adaptive controller 14, which may be a plurality of controllers 14, is used to track the frequency and amplitude of the modal response due to the vibration in the panel 22. The adaptive controller receives this information from the input signal generated by the array of sensor assemblies 12.

The blocked mode approach of the present invention requires a much simpler controller and with significantly less input and output channels than that presently needed for conventional active control approaches to the reduction of noise. For example, controlling the first mode of vibration in the panel 22 may require a single output and a pair of input (error) channels in the adaptive controller 14. Since the array of actuator assemblies 16 is being driven in phase and since the amplitude of the output signal to each actuator assembly 16 can be controlled outside of the adaptive controller 14, a single output channel yielding a single output signal will generally be sufficient. The two input channels may be needed to accommodate two input signals from a sensor assembly 12 associated with the particular actuator assembly 16. In general, each actuator assembly 16 is associated with a sensor assembly 12 such that the vibration in a particular location on the panel 22 is measured and blocked. In a similar fashion, the adaptive controller 14 may be provided with pair of output signals and four input signals for controlling the third mode of vibration in the panel 22. This may be a preferred embodiment as it allows controlling of both the first and third mode of vibration in the panel 22.

The adaptive controller 14 of the present invention may be implemented on a single chip which is essentially used to track the frequency and amplitude of the modal response of a lower order non-resonant mode in the panel 22 due to the incident airborne noise. The controller is not required to track, in a global sense, multitude of vibration modes of the structure. The degree of complexity of the controller is thus significantly reduced. In particular, the adaptive controller 14 may be an adaptive controller used for an active headset, similar to the one manufactured by Sony TransCom of Irvine, Calif. or Bose Corporation of Framingham, Mass.

Referring now to FIGS. **5*a* and 5*b*, an alternative embodiment of the sensor assembly 12 of the present invention is shown. In this embodiment, like features to those of the previous embodiment are designated by like reference numerals succeeded by the letter "a". The sensor assembly 12*a*, includes, in part, a first sensing member 24*a* and the second sensing member 26*a*. Each comprises a single sensing element 28*a*. Each of these sensing elements 28*a* is identical and specifically shaped to sense across a first non-resonant mode of vibration along each axis of the panel 22*a*. In this arrangement, the sensor assembly 12*a* is only able to accurately sense across the first non-resonant mode (1,1) of vibration in the panel 22*a*. Each of the first sensing member 24*a* and the second sensing member 26*a* is fitted with at least one sensing junction 30*a* for connection with the input signal wires 18*a***.

Figure 5A:
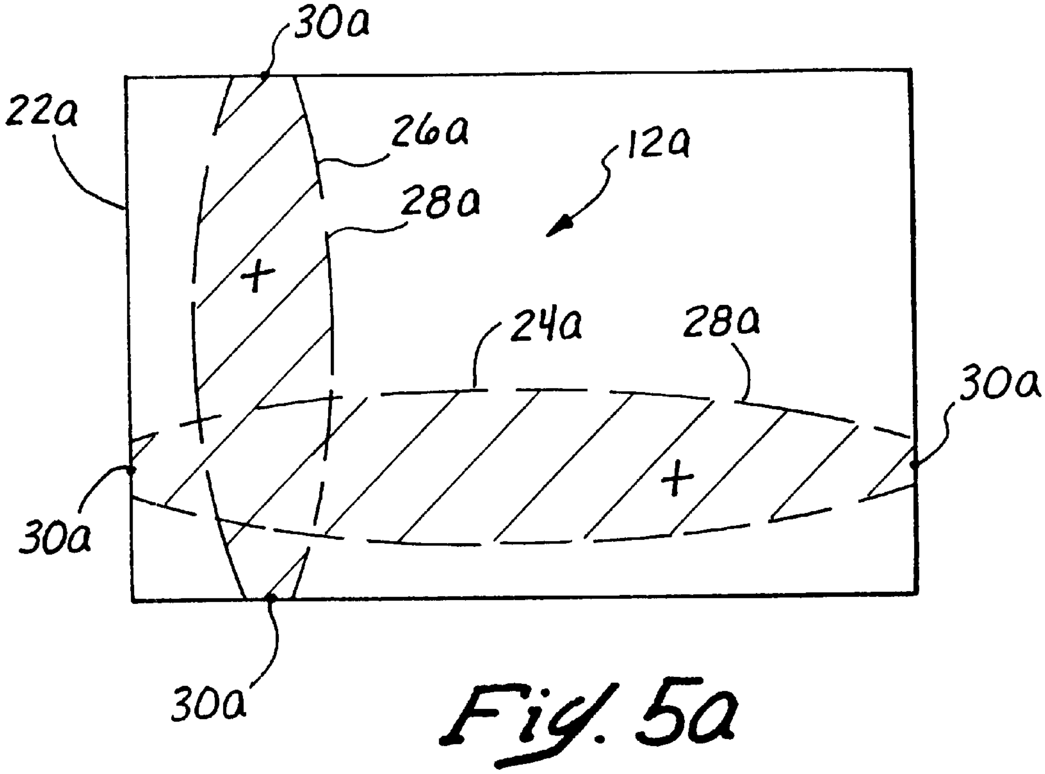
FIG. 5*a* is a simplified diagram showing an alternate embodiment of a pair of sensors of the present invention mounted on a panel.

Referring now in particular to FIG. **5*b*, an alternate embodiment of an actuator assembly 16*a* is shown mounted on a side of the panel 22*a*. The actuator assembly 16*a* comprises a first actuating member 32*a* and a second actuating member 34*a*. In this embodiment, the actuator assembly 16*a* is designed to vibrate or actuate across only the first non-resonant mode of vibration of the panel 22*a*. Like the sensor assembly 12*a* shown in FIG. 5*a*, each of the first actuating member 32*a* and the second actuating member 34*a* comprises a single actuating element 36*a*. The actuating elements 36*a* are identical and are specifically shaped to vibrate across the first non-resonant mode of vibration of the panel 22*a*. In this way, only the first non-resonant mode of vibration in the panel 22*a* is sensed by the sensor assembly 12*a* and generally opposed or blocked by the actuator assembly 16*a***.

In a method for reducing airborne noise transmitted by a vibrating panel 22, the sensor assembly 12 senses the vibration in the panel 22 and generates an input signal representing the first non-resonant mode of vibration in the panel 22. The input signal is sent to the controller 14 where the controller may use a digital filter to essentially match the input in real time generating an output signal having an amplitude essentially equivalent to the input signal but with an opposing phase. However the output signal may have an increased amplitude to make up for inefficiencies and losses in both the electrical communication lines 18 and 20 and the actuator assembly 16. The actuator assembly 16 is then forced to vibrate at the first non-resonant mode of vibration of the panel 22 but in an opposing fashion to the incident vibration and thus blocking the transmitted noise.

In a more specific aspect of the present invention, a method for reducing noise in an aircraft cabin transmitted by a vibrating panel comprises first measuring an odd numbered non-resonant mode of vibration in the panel using a sensor having a piezoelectric sensing surface and mounted on the panel. An input signal is then generated by the sensor with the signal representing the measured non-resonant mode of vibration. The input signal is then sent to a controller which generates an output signal. As previously described, the controller generates an output signal generally equivalent but opposing the input signal. The output signal is then sent to an actuator having a piezoelectric actuating surface and mounted on the panel such that the actuator vibrates to oppose the measured vibration.

In a preferred embodiment of this method, a plurality of sensor assemblies 12 are mounted on the panel 22 to form an array of sensor assemblies 50. In this fashion, vibration across the entire panel 22 may more precisely be determined. The input signal from each of the sensor assemblies 12 is generally summed and sent to the controller 14 where the controller generates an output signal. The output signal is then sent to a plurality of actuating assemblies 16 which are also disposed on the panel 22 as an array.

The sensor array 50 may preferably be comprised of a plurality of sensor assemblies 12 each having a first and second sensing member 24 and 26 specifically shaped for measuring the first and third non-resonant modes of vibration of the panel 22. In the same fashion, the actuator array (not shown) may preferably comprise a plurality of actuator assemblies 16, comprised of a first and second actuating member 32 and 34 each specifically shaped for actuating the panel 22 at its first and third non-resonant modes of vibration. Higher order non-resonant modes of vibration in the panel 22 may be blocked using sensor assemblies 12 and actuator assemblies 16 specifically shaped to measure and actuate in those modes.

While this invention has been described with respect to various specific examples and embodiments, it is to be understood that the invention is not limited thereto and that it can be variously practiced within the scope of the following claims.

What is claimed is:

1. An apparatus for reducing noise transmitted by a vibrating panel, said apparatus comprising:

a plurality of generally spaced apart sensors attached to said vibrating panel, each of said sensors comprising a voltage adder and a phase reverser and being adapted for generating an input signal in response to vibrations in said vibrating panel, said input signal having a first amplitude and a first phase;

an adaptive controller for receiving each of said input signals and being adapted for generating an output signal having a second amplitude and a second phase; and a plurality of generally spaced apart actuators attached to said vibrating panel, each of said actuators being adapted for receiving at least a portion of said output signal and being movable in response to said output signal.

2. An apparatus as recited in claim 1 wherein said vibrating panel has a first side and a second side and each of said plurality of sensors is mounted on said first side and each of said plurality of actuators is mounted on said second side.

3. An apparatus as recited in claim 1 wherein at least one of said plurality of sensors comprises a piezoelectric material shaped to sense an odd numbered non-resonant mode of vibration of said vibrating panel and to generate an input signal representing said odd numbered non-resonant mode.

4. An apparatus as recited in claim 3 wherein at least one of said plurality of actuators comprises a piezoelectric material shaped to vibrate at an odd numbered non-resonant mode when subject to said output signal.

5. An apparatus as recited in claim 1 wherein at least one of said plurality of sensors comprises a piezoelectric material shaped to sense a first non-resonant mode and a third non-resonant mode of vibration in said panel and to generate an input signal representing said first and third non-resonant modes of vibration in said panel.

6. An apparatus as recited in claim 5 wherein at least one of said plurality of actuators comprises a piezoelectric material shaped to vibrate at said first and said third non-resonant modes of vibration in said panel when subject to said output signal.

7. An apparatus as recited in claim 1 wherein said first amplitude in said input signal is generally equivalent to said second amplitude in said output signal.

8. An apparatus as recited in claim 1 wherein each of said plurality of actuators further comprises a voltage splitter and a phase reverser.

9. A method for reducing airborne noise transmitted by a vibrating panel, comprising the steps of:

measuring a first non-resonant mode of vibration in said vibrating panel using a plurality of sensors made from a piezoelectric material and attached to said vibrating panel, said plurality of sensors being distributed in an array which optimizes their ability to sense incident non-resonant modes of vibration in said panel;

generating an input signal having an amplitude and a phase representing said measured vibration from said plurality of sensors;

sending said input signal to a controller;

generating an output signal using said controller; and sending said output signal to a plurality of actuators made from a piezoelectric material and attached to said vibrating panel such that each said plurality of actuators is forced to vibrate in opposition to said first non-resonant mode of vibration in said panel.

10. The method as recited in claim 9 wherein said step of measuring additionally comprises measuring a third non-resonant mode of vibration in said vibrating panel and said step of sending said output signal additionally comprises forcing each of said plurality of actuators to vibrate in opposition to said first and said third non-resonant modes of vibration in said vibrating panel.

11. The method as recited in claim 9 and further comprising the step of repeating the steps of measuring, generating an input signal, sending said input signal, generating an output signal and sending said output signal to reflect any changes measured in said measuring step.

12. The method as recited in claim 11 wherein said step of generating an output signal comprises generating a revised output signal using said controller and a least means square algorithm.

13. The method as recited in claim 9 wherein said step of measuring and said step of generating an input signal generally occur simultaneously.

14. An apparatus for actively reducing noise in an aircraft transmitted by a vibrating interior panel, said apparatus comprising:

a plurality of generally spaced apart sensors mounted on said vibrating panel, each of said plurality of sensors being adapted for generating an input signal having a first amplitude and a first phase representing incident vibrations in said vibrating panel;

an adaptive controller being adapted for receiving each of said input signals and generating an output signal, said output signal having a second amplitude and a second phase, and generally comprising the sum of each of said input signals; and a plurality of generally spaced apart actuators mounted on said vibrating panel for receiving said output signal, each of said actuators being movable in response to said output signal.

15. An apparatus as recited in claim 14 wherein said vibrating panel has a first side and a second side and wherein each of said plurality of sensors are mounted on said first side and each of said plurality of actuators are mounted on said second side.

16. An apparatus as recited in claim 15 wherein said first side generally faces a source of said vibration in said vibrating panel.

17. An apparatus as recited in claim 14 wherein each of said plurality of sensors and each of said plurality of actuators comprises a layer of piezoelectric material.

18. An apparatus as recited in claim 14 wherein each of said plurality of sensors comprises a piezoelectric material shaped to sense and generated an input signal representing a first non-resonant mode of vibration of said vibrating panel and a third non-resonant mode of vibration of said vibrating panel.

19. An apparatus as recited in claim 14 wherein each of said plurality of actuators comprises a piezoelectric material shaped to vibrate at a first non-resonant mode of vibration and at a third non-resonant mode of vibration of said vibrating panel.

20. An apparatus as recited in claim 14 wherein each of said plurality of sensors and each of said plurality of actuators further includes a phase reverser.

21. A method for reducing noise in an aircraft transmitted by a vibrating interior panel, comprising the steps of:

distributing an array of sensors on said panel in such a manner as to optimize their ability to sense incident non-resonant modes of vibration therein, each of the sensors having a piezoelectric sensing surface;

measuring an odd numbered non-resonant mode of vibration in said panel using one sensor of said array of sensors;

generating an input signal representing said measured non-resonant mode of vibration on said panel using said one sensor;

sending said input signal to a controller through an input signal wire;

generating an output signal using said controller; and sending said output signal to an actuator having a piezoelectric actuating surface and mounted on said panel such that said actuator vibrates to oppose said measured vibration.

22. The method as recited in claim 21 wherein said step of measuring comprises measuring a first non-resonant mode of vibration in said panel.

23. The method as recited in claim 21 wherein said step of measuring comprises measuring a first and a third non-resonant mode of vibration in said panel.

24. An apparatus for reducing noise transmitted by a vibrating panel, said apparatus comprising:

a plurality of generally spaced apart sensors attached to said vibrating panel, each of said sensors being adapted for generating an input signal in response to vibrations in said vibrating panel, said input signal having a first amplitude and a first phase;

an adaptive controller for receiving each of said input signals and being adapted for generating an output signal having a second amplitude and a second phase; and a plurality of generally spaced apart actuators attached to said vibrating panel, each of said actuators comprising a voltage splitter and a phase reverser and being adapted for receiving at least a portion of said output signal and being movable in response to said output signal.

25. An apparatus as recited in claim 24 wherein each of said plurality of sensors further comprises a voltage adder and a phase reverser for generating said input signal.

* * * * *